United States Patent [19]
Jonas et al.

[11] Patent Number: 5,403,467
[45] Date of Patent: Apr. 4, 1995

[54] PROCESS FOR THROUGH-HOLE PLATING OF TWO-LAYER CIRCUIT BOARDS AND MULTILAYERS

[75] Inventors: Friedrich Jonas, Aachen; Gerhard-Dieter Wolf, Dormagen, both of Germany

[73] Assignee: Bayer AG, Leverkusen, Germany

[21] Appl. No.: 5,779

[22] Filed: Jan. 19, 1993

[30] Foreign Application Priority Data

Jan. 29, 1992 [DE] Germany ............... 42 02 337.8

[51] Int. Cl.6 .................. C25D 5/00; C25D 5/02; C25D 5/54
[52] U.S. Cl. ..................... 205/125; 205/185; 427/97
[58] Field of Search ............... 205/125, 185; 427/97

[56] References Cited

U.S. PATENT DOCUMENTS 5,035,926 7/1991 Jonas et al. ............... 427/393.1

FOREIGN PATENT DOCUMENTS

| 3806884 | 3/1988 | Germany . |
| 3927440 | 8/1989 | Germany . |
| WO89/08375 | 9/1989 | WIPO . |
| 8908375 | 9/1989 | WIPO . |
| 9108324 | 6/1991 | WIPO . |

OTHER PUBLICATIONS

Abstract of EP-A-0502023 (from "Orbit").

*Primary Examiner*—John Niebling
*Assistant Examiner*—Edna Wong
*Attorney, Agent, or Firm*—Connolly & Hutz

[57] ABSTRACT

A process for through-hole plating of two-layer circuit boards and multilayers using polythiophenes as a conductive agent on the side walls of through-holes for the direct through-hole plating and to the circuit boards and multilayers thus produced.

5 Claims, No Drawings

PROCESS FOR THROUGH-HOLE PLATING OF TWO-LAYER CIRCUIT BOARDS AND MULTILAYERS

This invention relates to a process for through-hole plating of two-layer circuit boards and multilayers using polythiophenes as a conductive agent on the side walls of through-holes for the direct through-hole plating. The present invention also relates to the circuit boards and multilayers thus produced.

Processes for the through-hole plating of circuit boards based, for example, on glass filled epoxy resins and laminated with copper on both sides are known (cf. Herrmann, Handbuch der Leiterplattentechnik, Eugen G. Leuze Verlag, Saulgau). In general; the walls of the through-holes in the circuit boards are coated with metals, preferably copper, by methods known per se in chemical metallizing baths and electrically conductive connections are thus established between the top and bottom of the circuit boards. Very often, these conductive connections are reinforced by the electrodeposition of copper from copper baths.

Processes in which, instead of using electroless copper baths, copper is directly applied by electrodeposition to the hole walls of circuit boards have recently been acquiring increasing interest. To this end, the hole walls have to be provided with an electrically conductive coating before electrodeposition of the copper. This coating has to be uniformly applied and must be sufficiently electrically conductive to serve as a basis for satisfactory electrodeposition of copper on the whole wall surface ("through-hole plating").

According to DE-PS 3 806 884 (WO 89/08375) and DE-OS 3 927 440, polypyrrole is used as a conductive coating in through-holes for the electrodeposition of copper. The production processes involve the following steps:

1. formation of through-holes in the copper-laminated boards (base materials)
2. oxidative pretreatment of the holes, for example with alkaline potassium permanganate solution
3. rinsing with water
4. treatment with a pyrrole solution
5. treatment with an aqueous acid to initiate polymerization of the pyrrole to form the conductive polypyrrole coating in the hole
6. rinsing with water
7. electrodeposition of copper In the practical application of the process, it was found that the pyrrole applied to the through-hole wall and to the surface of the circuit board in step 4 not only polymerizes on the wall of the hole in accordance with the purpose of that process to form the conductive coating when it is immersed in the acid-containing bath in step 5, it is also separated off to a considerable extent and polymerized in a kind of "wild polymerization" in the acid bath itself. As a result, polypyrrole sludge is formed and has to be repeatedly removed from bath 5.

In addition, pyrrole—on account of its low vapor pressure—may spread in the production plant and polymerise anywhere where it is contacted with acid or acid vapors.

The present invention relates to a process for the production of through-hole plated circuit boards and multilayers which avoids the described disadvantages, more particularly the formation of polymers, in the acid baths required for the treatment.

The present invention relates to a process for the production of through-hole plated circuit boards and multilayers in which a conductive layer of a polythiophene is produced on the walls of through-holes provided in the board by treatment with a solution or emulsion of a thiophene corresponding to general formula (I)

in which
X is oxygen or a single bond,
$R_1$ and $R_2$ independently of one another represent hydrogen or a $C_{1-4}$ alkyl group or together form an optionally substituted $C_{1-4}$ alkylene radical, preferably a methylene radical optionally substituted by alkyl groups, a 1,2-ethylene radical optionally substituted by $C_{1-12}$ alkyl or phenyl groups, a 1,3-propylene radical or a 1,2-cyclohexylene radical, and simultaneous or subsequent treatment with an aqueous acid and a metal is applied by electrodeposition to the conductive layer thus produced.

One particular advantage is that, where thiophenes corresponding to formula (I) are used, application of the thiophene and its polymerization by acid can be combined into a single step.

It is also possible to use distinctly lower monomer concentrations than where pyrrole is employed.

Accordingly, the process according to the invention involves the following steps:

1. formation of through-holes in copper-laminated circuit boards (base materials)
2. oxidative pretreatment of the holes, for example with an alkaline potassium permanganate solution
3. rinsing with water
4. treatment with a solution or emulsion of a thiophene corresponding to formula (I)
5. treatment with an aqueous acid to initiate the polymerization
6. rinsing with water
7. electrodeposition of copper.

Steps 4 and 5 can be combined into a single step by using thiophene solution or emulsion and an acid. This embodiment is preferred. Steps 1, 2, 3, 6 and 7 correspond to the prior art and are carried out in known manner. Potassium permanganate is preferably used as the oxidizing agent in step 2.

In step 4 according to the invention, solutions or emulsions of a monomer corresponding to formula (I)

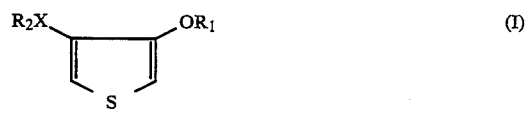

in which
X is oxygen or a single bond,
$R_1$ and $R_2$ independently of one another represent hydrogen or a $C_{1-4}$ alkyl group or together form an optionally substituted $C_{1-4}$ alkylene radical, preferably a methylene radical optionally substituted by alkyl groups, a 1,2-ethylene radical optionally substituted by $C_{1-12}$ alkyl or phenyl groups, a 1,3-propylene radical or a 1,2-cyclohexylene radical, are used.

In formula I, $R_1$ and $R_2$ together are preferably 1,2-alkylene radicals derived from the 1,2-dibromoalkenes obtainable by the bromination of α-olefins, such as ethene, prop-1-ene, hex-1-ene, oct-1-ene, dec-1-ene, dodec-1-ene and styrene; or 1,2-cyclohexylene, 2,3-butylene, 2,3-dimethyl-2,3-butylene and 2,3-pentylene.

The methylene, 1,2-ethylene and 1,3-propylene radicals are particularly preferred. The 3,4-ethylenedioxythiophene corresponding to formula (II)

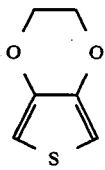

is particularly preferred.

The monomers corresponding to formula (I) may be used in a concentration of 0.1 to 10% by weight, preferably in a concentration of 0.2 to 5% by weight and, more preferably, in a concentration of 0.5 to 2.5% by weight, based on the solution or emulsion as a whole in process step 4.

Organic or inorganic acids may be used as the acids for step 5.

Examples of organic acids are aromatic sulfonic acids, such as p-toluenesulfonic acid, benzenesulfonic acid, dodecyl benzenesulfonic; aliphatic sulfonic acids, such as methanesulfonic acid and trifluoromethanesulfonic acid; carboxylic acids, such as formic acid and acetic acid.

Examples of inorganic acids are sulfuric, phosphoric and hydrochloric acid.

Other suitable acids are polymeric organic acids, such as polyacrylic acid, polystyrenesulfonic acid, polyvinylsulfonic acid or copolymers of these acids with other monomers free from acid groups.

The acids may be used in a concentration of 0.1 to 30% by weight and preferably in a concentration of 1 to 10% by weight, based on the total quantity of the solution or emulsion in process step 4.

Surfactants may be added to improve wettability and, in the case of emulsions, to increase the stability of the emulsions. The following surfactants are mentioned by way of example: polyethers of oleyl alcohol+50 mol ethylene oxide, polyethers of oleyl alcohol+10 mol ethylene oxide, polyesters of castor oil+10 mol ethylene oxide, polyether esters of oleic acid+6 mol ethylene oxide, polyethers of lauryl alcohol+5 mol ethylene oxide, polyether esters of abietic acid+40 mol ethylene oxide, 3-benzyl-4-hydroxybiphenyl polyglycol ether, glycerol-1,3-bis-(2-ethylhexyl ether)-2-sulfuric acid ester, Na salt, disec. butyl naphthalenesulfonate, benzyl dodecyl dimethyl ammonium chloride, 2-sulfosuccinic acid sodium salt diisooctyl ester.

Water is preferably used as the solvent or emulsion medium. To improve the solubility of the thiophenes corresponding to formula (I), water-miscible organic solvents can be added to the solution or emulsion of acid and thiophene corresponding to formula (I).

Suitable organic solvents are lower alcohols, such as methanol, ethanol, isopropanol; polyhydric alcohols, such as glycol and glycerol; aliphatic ethers, such as ethyl glycol and butyl glycol; aliphatic ketones, such as acetone; and linear or cyclic amides, such as N,N-dimethyl formamide, N,N-dimethyl acetamide, N-methyl pyrrolidone.

The organic solvents are added to the solutions or emulsions according to the invention in a quantity of 0 to 100% by weight and preferably in a quantity of 0 to 50% by weight of the solvent as a whole.

The treatment of the boards in step 4 is preferably carried out at temperatures of 0° to 90° C. and, more preferably, at temperatures of 10° to 50° C.

The treatment time is preferably between 1 second and several minutes and preferably between 5 seconds and 2 minutes.

The process according to the invention for the production of through-hole plated two-layer circuit boards and multilayers using polythiophenes as a conductive agent for the through holes for the direct through-hole plating may be carried out using any of the hitherto known base materials for circuit boards. The following copper-laminated laminates: phenolic resin/hard paper, epoxy resin/hard paper and epoxy resin/hard glass fabric, are preferably used, particularly good results being obtained with the epoxy resin/hard glass fabric.

The through-connection may be carried out in tanks and equipment of the type typically used in the prior art, although through-connection by the horizontal technique is preferably used, especially when particularly thin holes and those with unfavorable length-to-cross section ratios (as in multilayers for example) are to be through-hole plated.

EXAMPLES

Example 1

Into a circuit board of glass-fiber-reinforced epoxy resin laminated with copper on both sides holes are drilled. The board is then submerged with agitation in a solution of 2 g potassium permanganate, 1 g sodium hydroxide and 100 ml water at 90° C. for 10 minutes. The board is then rinsed with water until the water running off is colorless. The board is then immersed for 30 seconds in an emulsion of 0.5 g 3,4-ethylene dioxythiophene, 2.0 g polystyrenesulfonic acid (molecular weight approx. 30,000), 0.2 g 2-sulfosuccinic acid Na salt diisooctyl ester and 100 ml water, and again rinsed in running water. To plate the holes with copper, the board is fixed to an electroplating frame and electroplated for 10 minutes in a copper electroplating bath (®Cupracid 210, Schering) at a voltage of 1.9 volt to obtain a firmly adhering and continuous copper coating.

Example 2

A copper-laminated circuit board is pretreated with a potassium permanganate solution and rinsed with water as described in Example 1. The board is then immersed for 30 seconds in an emulsion of 5.0 g 3,4-ethylene dioxythiophene, 15 g polystyrenesulfonic acid sodium salt (molecular weight approx. 30,000), 5 g 98% sulfuric acid, 0.2 g 2-sulfosuccinic acid Na salt diisooctyl ester as surfactant in 1 liter water. The board is then rinsed in running water and copper-plated in the same way as described in Example 1. This treatment took about 8 minutes until the holes were completely covered with copper (current density 1 to 10 A/dm$^2$). The circuit board thus through-hole plated was electroplated with a 25 μm thick copper layer in the holes. The heat-stock test typically applied to circuit boards was passed without difficulty.

Example 3

The procedure is as in Example 1 using an emulsion of 5.0 g 3,4-ethylenedioxythiophene, 10 g polystyrenesulfonic acid, 10 g polystyrenesulfonic acid sodium salt, 2.0 g 98% sulfuric acid, 2.0 g 3-benzyl-4-hydroxybiphenyl polyglycol ether and 1 liter water. After copper plating, all the drill holes are provided with a firmly adhering and continuous, uniform layer of copper.

Example 4

A copper-laminated, drilled circuit board is pretreated with a potassium permanganate solution and rinsed with water in the same way as described in Example 1. The board is then immersed for 1 minute in a 2% solution of 3,4-ethylenedioxythiophene in isopropanol. The board is then immersed for 1 minute in a 20% aqueous sulfuric acid. The board is rinsed in running water and is copper-plated as described in Example 1. During this treatment, the holes become completely coated with copper.

Example 5

A circuit board of glass-fiber-reinforced epoxy resin (FR-4 quality) laminated on both sides with copper is provided with drill holes. The board is treated for 10 minutes with agitation in a solution of 2 g potassium permanganate, 1 g sodium hydroxide and 100 ml water at 90° C. and subsequently rinsed with water until the rinsing water running off is colorless. The board is then immersed for 2 minutes in an emulsion which has been prepared from 1.5 g 3,4-ethylenedioxythiophene, 0.3 g 2-sulfosuccinic acid Na salt diisooctyl ester and 100 ml water. The board is then treated for 5 minutes in a 3% aqueous solution of polystyrene sulfonic acid (molecular weight approx. 30,000) and rinsed in running water. To plate the drill holes with copper, the board is fixed to an electroplating frame and is electroplated for 5 minutes in a commercial copper electroplating bath at a voltage of 1.9 V, a firmly adhering, continuous copper coating being formed in the holes.

Example 6

A copper-laminated circuit board provided with holes is pretreated with a potassium permanganate solution and rinsed with water in the same way as described in Example 1.

The board is then immersed for 1 minute in a 3% solution of 3,4-ethylenedioxythiophene in a mixture of 70 parts by weight water and 30 parts by weight butyl glycol. The board is then immersed for 1 minute in a approx. 3% aqueous solution of polystyrene acid. The board is rinsed in running water and copper-plated in the same way as described in Example 1. During this treatment, the holes become completely coated with a firmly adhering layer of copper.

Example 7

A circuit board of glass-fiber-reinforced epoxy resin (FR-4 quality) laminated on both sides with copper is provided with holes. The board is treated for 10 minutes with agitation in a solution of 2 g potassium permanganate, 1 g sodium hydroxide and 100 ml water at 90° C. and subsequently rinsed with water until the rinsing water running off is colorless.

The board is then immersed for 20 seconds in an emulsion of 1.0 g 3,4-ethylene dioxythiophene, 2.0 g polystyrenesulfonic acid (molecular weight approx. 30,000), 1.0 g poly-ether-oxi-sorbitan-oleat and 100 ml water. The board is then rinsed in running water. To plate the holes with copper, the board is fixed to an electroplating frame and electroplated for 10 minutes in a copper electroplating bath (®Cupracid 210, Schering) at a voltage of 1.9 volt to obtain a firmly adhering and continuous copper coating.

We claim:

1. A process for the production of through-hole plated circuit boards and multilayers, wherein a conductive layer of a polythiophene is produced on the walls of the through-holes provided in the board by treatment with an emulsion of 3,4-ethylenedioxythiophene, said process comprising the following steps:
   a) formation of through-holes in copper-laminated circuit boards (base materials);
   b) oxidative treatment of the through-holes with an alkaline potassium permanganate solution;
   c) rinsing with water;
   d) treatment with an emulsion consisting essentially of 3,4-ethylenedioxythiophene and water;
   e) treatment with an acid;
   f) rinsing with water; and
   g) electrodeposition of copper.

2. A process as claimed in claim 1, wherein steps d and e are combined into a single step.

3. A process as claimed in claim 1, wherein the emulsion in step (d) consists of water and 0.1 to 10% by weight of 3,4-ethylenedioxythiophene.

4. A process as claimed in claim 1, wherein the emulsion in step (d) consists of water and 0.2 to 5% by weight of 3,4-ethylenedioxythiophene.

5. A process as claimed in claim 1, wherein the emulsion in step (d) consists of water and 0.5 to 2.5% by weight of 3,4-ethylenedioxythiophene.

* * * * *